United States Patent
Presswala et al.

(10) Patent No.: US 11,171,649 B1
(45) Date of Patent: Nov. 9, 2021

(54) STATIC AND INTERMITTENT DYNAMIC MULTI-BIAS CORE FOR DUAL PAD VOLTAGE LEVEL SHIFTER

(71) Applicant: QUALCOMM Incorporated, San Diego, CA (US)

(72) Inventors: Aliasgar Presswala, San Diego, CA (US); Wilson Jianbo Chen, San Diego, CA (US); Chiew-Guan Tan, San Diego, CA (US); Reza Jalilizeinali, Oceanside, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/071,796

(22) Filed: Oct. 15, 2020

(51) Int. Cl.
   *H03K 19/003* (2006.01)
   *H03K 19/0175* (2006.01)
   *H03K 19/0185* (2006.01)
   *H03K 3/356* (2006.01)

(52) U.S. Cl.
   CPC .......... *H03K 19/018521* (2013.01); *H03K 3/356113* (2013.01)

(58) Field of Classification Search
   None
   See application file for complete search history.

(56) References Cited

U.S. PATENT DOCUMENTS 8,531,227 B2 *  9/2013  Kumar ........... H03K 19/018528
                                            327/333

* cited by examiner

*Primary Examiner* — Kenneth B Wells
(74) *Attorney, Agent, or Firm* — Loza & Loza, LLP (57) ABSTRACT

An output driver in an integrated circuit includes a voltage shifter. The output driver has a low voltage section configured to provide a low voltage signal responsive to an input signal and a high voltage section configured to provide a high voltage signal responsive to the input signal. A first biasing circuit is configured to provide a bias to a first transistor in the high voltage section such that the bias is modified during a transition in the output signal. A second biasing circuit is configured to turn on a second transistor in the high voltage section when the output signal is at a low voltage level. The second transistor is configured to discharge a terminal of the first transistor. The input signal switches between 0 Volts and 0.9 Volts. The output signal switches between 0 Volts and 1.2 Volts or between 0 Volts and 1.8 Volts.

30 Claims, 10 Drawing Sheets

STATIC AND INTERMITTENT DYNAMIC MULTI-BIAS CORE FOR DUAL PAD VOLTAGE LEVEL SHIFTER

TECHNICAL FIELD

The present disclosure relates generally to interface circuits in integrated circuit devices, and more particularly, to support of multiple pad voltage levels for different process technologies employed in integrated circuit devices.

BACKGROUND

Increasing demand for greater functionality in apparatus including cellular telephones, smart phones, global positioning satellite navigators, media players and the like requires the development of semiconductor integrated circuit (IC) devices that have higher circuit density and which switch at higher frequencies to provide increased functionality and speed of operation with low power. Advances in speed and size may be accomplished through the use of ICs fabricated with decreased process geometries and/or lowered operating voltages. ICs may include processors with core logic circuits that operate a low core voltage, where the processor provides an interface to input and output (I/O) circuits and/or drivers that function at higher voltages. In one example, an apparatus may employ one or more ICs that include a processing device with 0.9 volt core logic and interface circuits and devices that operate at voltage levels including 1.2 volts and 1.8 volts.

Device manufacturing technology continues to improve, and operational characteristics of communication interfaces may be affected by improvements in process technology. Accordingly, many electronic devices and appliances include circuits that shift between logic levels defined for different circuits that are associated with different voltage domains, or that otherwise translate digital logic signals from a low voltage range to a higher voltage range. There is accordingly an ongoing need for improved level translation circuits and devices.

SUMMARY

Certain aspects of the disclosure relate to systems, apparatus, methods and techniques for implementing and managing digital communication interfaces that may be used between IC devices in various apparatus. In some aspects, the digital communication interfaces provide methods, protocols and techniques that may be used to provide an output level shifting circuit that can operate at high frequency while avoiding overstress on low voltage transistors.

In various aspects of the disclosure, a method for configuring an output driver includes configuring a low voltage section of the output driver to provide a low voltage signal responsive to an input signal that switches between a first voltage level and a second voltage level, the low voltage signal switching between the first voltage level and a third voltage level in a first mode and between the first voltage level and a second voltage level in a second mode, configuring a high voltage section to provide a high voltage signal responsive to the input signal, the high voltage signal switching between the first voltage level and the third voltage level in the first mode and between the second voltage level and a fourth voltage level in the second mode, configuring a first pair of output transistors in the high voltage section and a second pair of output transistors in the low voltage section of the output driver to provide an output signal responsive to the input signal, the output signal switching between the first voltage level and the third voltage level in the first mode and between the first voltage level and the fourth voltage level in a second mode, and configuring a first biasing circuit to provide a bias to a first transistor in the first pair of output transistors such that the bias is modified during a transition in the output signal.

In various aspects of the disclosure, an apparatus includes a low voltage section, and a high voltage section. The low voltage section is configured to provide a low voltage signal responsive to an input signal that switches between a first voltage level and a second voltage level, the low voltage signal switching between the first voltage level and a third voltage level in a first mode and between the first voltage level and a second voltage level in a second mode. The high voltage section is configured to provide a high voltage signal responsive to the input signal, the high voltage signal switching between the first voltage level and the third voltage level in the first mode and between the second voltage level and a fourth voltage level in the second mode. A first pair of output transistors in the high voltage section and a second pair of output transistors in the low voltage section are configured to provide an output signal responsive to the input signal, the output signal switching between the first voltage level and the third voltage level in the first mode and between the first voltage level and the fourth voltage level in a second mode. A first biasing circuit is configured to provide a bias to a first transistor in the first pair of output transistors such that the bias is modified during a transition in the output signal.

In various aspects of the disclosure, an apparatus includes means for providing a low voltage signal responsive to an input signal that switches between a first voltage level and a second voltage level, the low voltage signal switching between the first voltage level and a third voltage level in a first mode and between the first voltage level and a second voltage level in a second mode, means for providing a high voltage signal responsive to the input signal, the high voltage signal switching between the first voltage level and the third voltage level in the first mode and between the second voltage level and a fourth voltage level in the second mode, means for providing an output signal responsive to the input signal, the output signal switching between the first voltage level and the third voltage level in the first mode and between the first voltage level and the fourth voltage level in a second mode, and means for biasing a first output transistor such that a bias provided to the first output transistor is modified during a transition in the output signal.

In one aspect, the bias is provided to the first transistor through an active transistor that has a drain-to-source resistance. The output signal may be capacitively coupled to the first biasing circuit through a gate to drain capacitance of the first transistor. The bias may be modified for a duration determined by a resistance-capacitance (RC) time constant associated with capacitive coupling between the drain and gate of the first transistor.

In one aspect, a second biasing circuit is configured to turn on a second transistor in the high voltage section when the output signal is at a low voltage level. The second transistor may be configured to discharge a terminal of the first transistor.

In one aspect, the first voltage level corresponds to a 0 Volt level, and the second voltage level corresponds to a 0.9 Volt level. The third voltage level may correspond to a 1.2 Volt level. The fourth voltage level may correspond to a 1.8 Volt level. The input signal may switch between 0 Volts and 0.9 Volts. The input signal may be received from 0.9 Volt core logic of an integrated circuit. The output signal may be provided to an input/output pad of the IC. In one example, the input signal is received from core logic of an integrated circuit. The output signal may be provided to an input/output pad of the IC.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs. Design rules for newer process technology that use low-voltage transistors may preclude the use of higher voltage transistors supported by previous process technology generations. The unavailability of certain higher-voltage transistors may present an impediment to circuit designers for IC devices that include multiple voltage domains.

Figure 1:
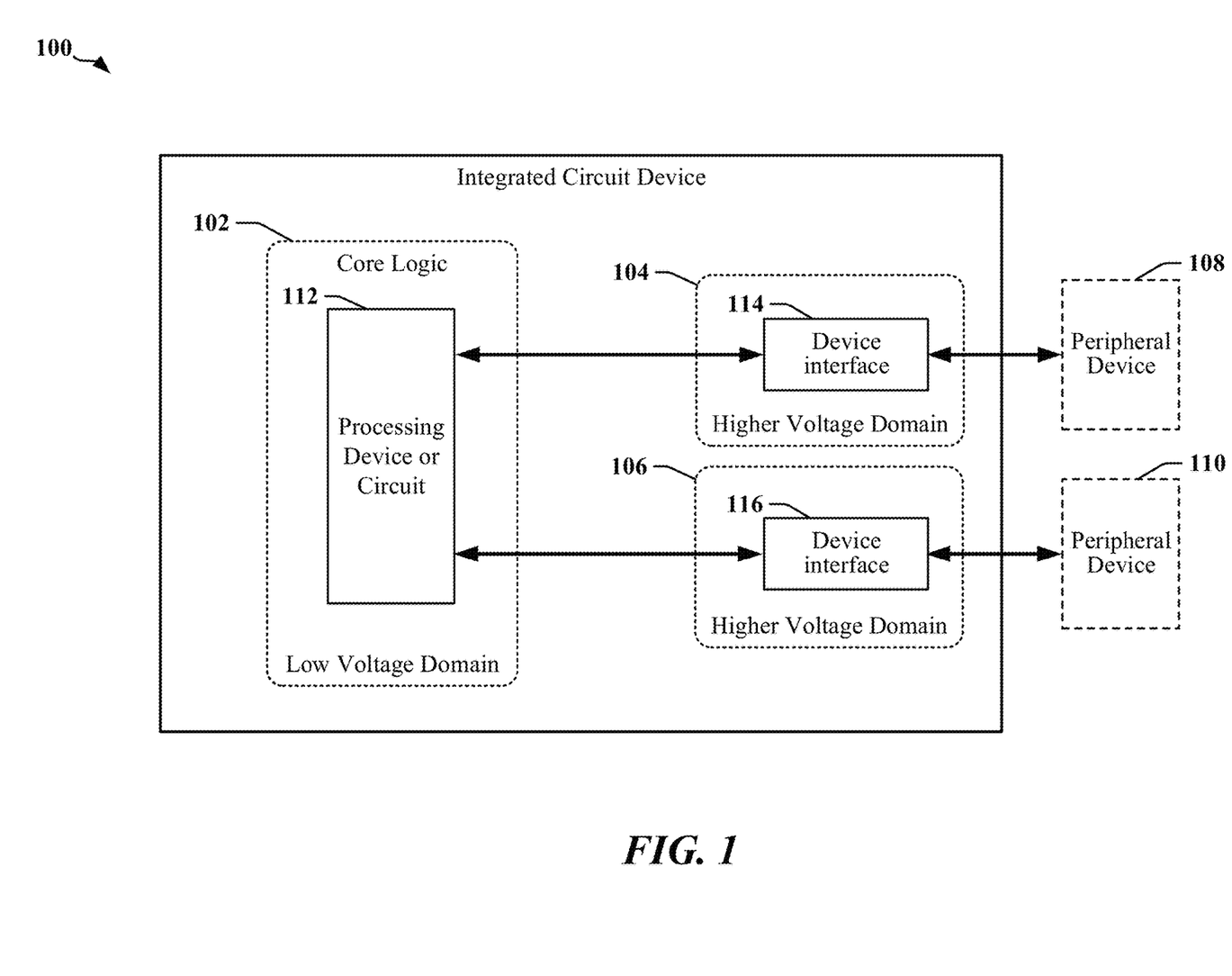
FIG. 1 illustrates an example of an IC device that includes multiple voltage domains.

FIG. 1 illustrates an example of an IC device 100 that includes multiple voltage domains 102, 104 and 106. Typically, the voltage domains 102, 104 and 106 are not defined by physical boundaries and the IC device 100 may include circuits 112, 114, 116 which can operate in a single voltage domain 102, 104, or 106 or in two or more different voltage domains 102, 104 and/or 106. In one example, the IC device 100 may include a communication device that is configured to support multimedia devices, radio frequency (RF) modems and/or other high-frequency devices.

In the illustrated IC device 100, a processing circuit 112 may be configured to communicate, manage or control peripheral devices 108, 110 that operate at different voltages. Core logic may operate in a low voltage domain 102 and may include or cooperate with peripheral interface circuits 114, 116 that operate in higher voltage domains 104, 106. In various examples, the low voltage domain 102 may have a nominal voltage level that lies within the range of 0.465 Volts to 0.9 Volts. In other examples, a different nominal voltage level or range of voltage levels may be defined for the low voltage domain 102. The operating voltage of the higher voltage domains 104, 106 may be defined or configured based on application or design requirements.

For the purpose of this disclosure, various circuits are described using the example of an IC device 100 that provides three distinct voltage domains, where the low voltage domain 102 is operated at 0.9 Volts, a first higher voltage domain 104 is operated at 1.2 Volts and a second higher voltage domain 106 is operated at 1.8 Volts. Certain concepts disclosed herein apply equally to circuits that and devices that can operate in voltage domains 102, 104, 106 that may be defined with some combination of voltages. For example, the low voltage domain 102 may be operated at 0.465 Volts, or at a voltage that lies within a nominal range (e.g., 0.465-0.9 Volts) or at a voltage higher than 0.9 Volts or lower than 0.465 Volts. In other examples, the core logic 112 may operate in a voltage domain that has a higher voltage level than one or more voltage domains that includes a peripheral interface circuit 114 or 116.

In one example, the core logic includes a processing circuit 112 that interacts with lower-frequency higher voltage peripheral devices 108 through the second peripheral interface circuit 116 and with higher-frequency, lower-voltage peripheral devices 110 through the first peripheral interface circuit 114. Logic level shifting circuits may be provided in the core logic or in the peripheral interface circuits 114, 116 to enable translation of signals between the voltage domains.

The IC device 100 may include one or more communication links, where physical conductive pads provide a connection point through which signals may be transmitted and/or received. The term pad may refer to a physical pad and an associated driver circuit that is configured for driving a load that has a specified impedance, at specified voltage and current levels or ranges, and under specified noise levels, electrostatic discharges, and electromagnetic induction.

According to certain aspects, electronic devices operating at different voltage levels may be subcomponents of an apparatus such as a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, a wearable computing device (e.g., a smart watch, a health or fitness tracker, eyewear, etc.), an appliance, a sensor, a security device, a vending machine, a smart meter, a drone, a multicopter, or any other similar functioning device.

Figure 2:
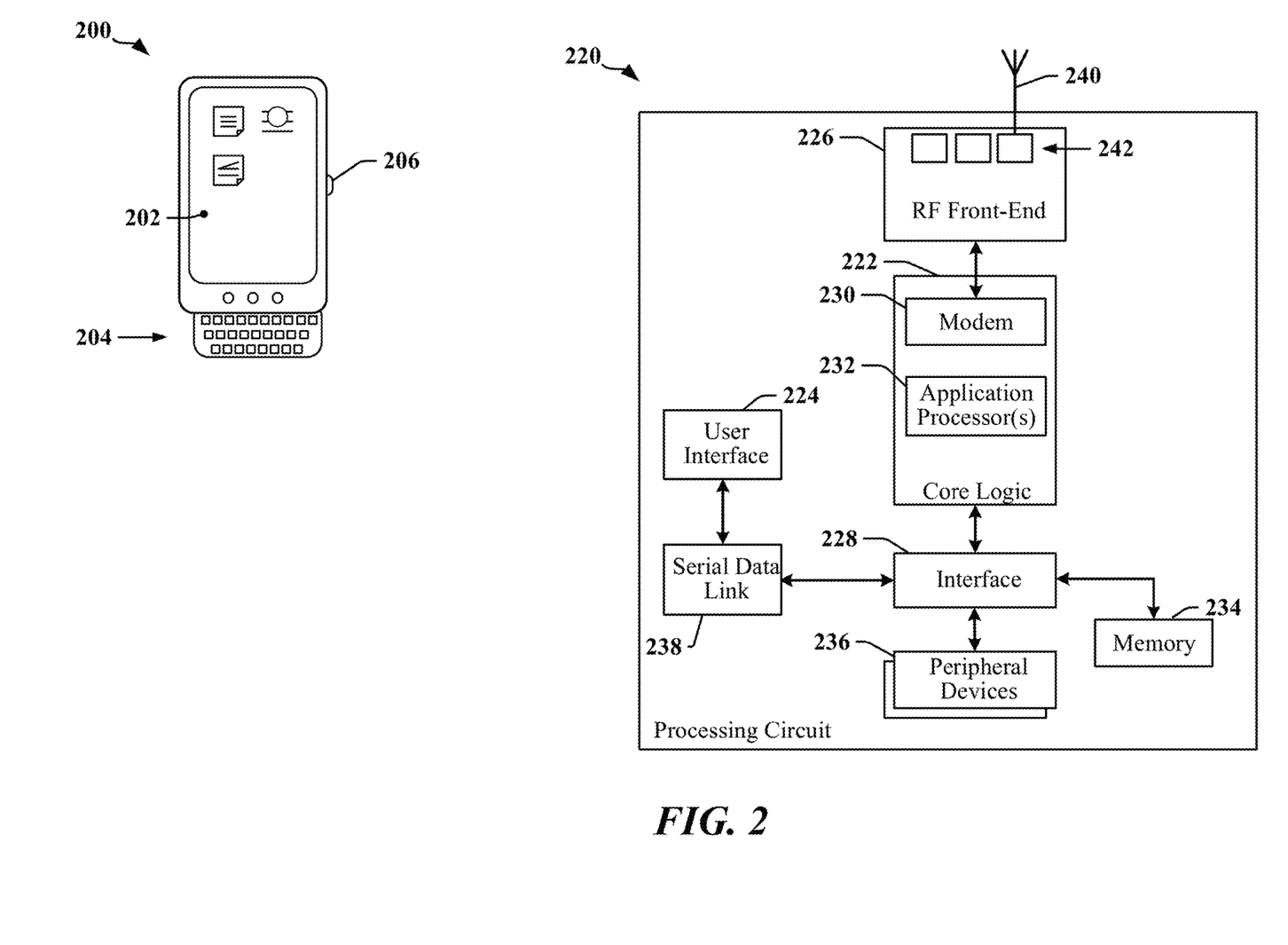
FIG. 2 depicts an example of an apparatus that may be adapted in accordance with certain aspects disclosed herein.

FIG. 2 depicts an example of an apparatus 200 that includes a processing circuit 220 having multiple circuits or devices 222, 224, 226, 228, 234, 236, and/or 238. The processing circuit 220 may be implemented in an application-specific integrated circuit (ASIC), system-on-chip (SoC) or on another type of IC. The processing circuit 220 may include multiple circuits or devices 222, 224, 226, 228, 234, 236, and/or 238. In one example, the apparatus 200 may be used to implement a communication device and the processing circuit 220 may include an RF front-end device 226 that enables the apparatus to communicate through one or more antennas 240 with a radio access network, a core access network, the Internet and/or another network. The RF front-end device 226 may include a plurality of devices 242 coupled by a second communication link, which may include an RFFE bus.

In the example illustrated in FIG. 2, the processing circuit 220 includes core logic 222 that has one or more processors 232, one or more modems 230, and/or other logic circuits or functions. The processing circuit 220 may be controlled by an operating system and may provide an application programming interface (API) layer that enables the one or more processors 232 to execute software modules residing in the memory device 234, for example. The software modules may include instructions and data stored in a processor readable storage such as the memory device 234. The core logic 222 may implement memory, provide an interface to the memory device 234 of the processing circuit 220, and/or to external memory. Memory may include read-only memory (ROM) or random-access memory (RAM), electrically erasable programmable ROM (EEPROM), flash cards, or any memory device that can be used in processing systems and computing platforms. The processing circuit 220 may include, or have access to a local database or other parameter storage that can maintain operational parameters and other information used to configure and operate the apparatus 200 and/or the processing circuit 220. The local database may be implemented using registers, a database module, flash memory, magnetic media, EEPROM, optical media, tape, soft or hard disk, or the like. The processing circuit 220 may also be operably coupled to external devices such as the antenna 240, a display 202, operator controls, such as a button 206 and/or an integrated or external keypad 204, among other components. A user interface 224 may communicate with the display 202, external keypad 204, etc. through a dedicated communication link 238 or through one or more serial data interconnects.

The processing circuit 220 may communicate through one or more interface circuits 228, which may include a combination of circuits, counters, timers, control logic and other configurable circuits or modules. In one example, the interface circuit 228 may be configured to operate in accordance with communication specifications or protocols. The processing circuit 220 may include or control a power management function that configures and manages the interface circuit 228, the user interface 224, the RF front-end circuit 226, and the operation of one or more application processors 232 resident at least in part in the core logic 222, for example.

Figure 3:
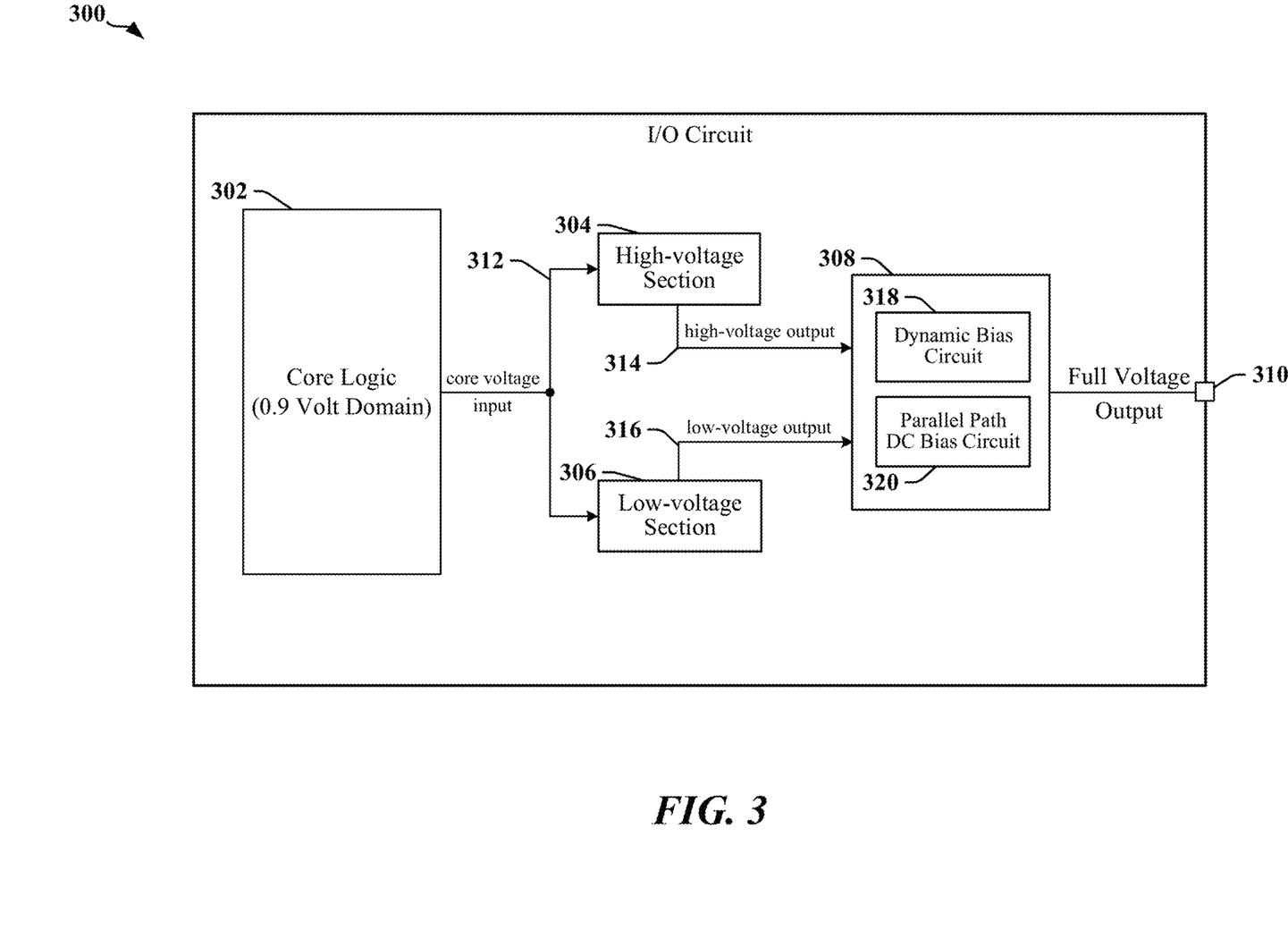
FIG. 3 illustrates a first example of an output level shifting circuit provided in accordance with certain aspects of this disclosure.

With reference to FIG. 3, certain aspects of this disclosure provide an output level shifting circuit 300 that can operate at high frequency while avoiding overstress on low voltage transistors. The output level shifting circuit 300 may receive an input 312 from the low voltage core logic and may provide an output 310 that switches within a voltage range higher than the voltage range of the core voltage. The input 312 may include complementary positive and negative input signals and output 310 may include complementary positive and negative output signals. The output 310 may be coupled to one or more I/O pads.

In one example, a core 302 operates at a voltage of 0.9 Volts and the output can be configured for a 1.2 Volt range in a first mode and a 1.8 Volt range in a second mode. Level shifting is accomplished using a high-voltage section 304 and a low voltage section 306. In some implementations, the high-voltage section 304 couples an output and a low voltage section 306.

In one example, the high-voltage section 304 operates between 0.9 Volts and 1.8 Volts, while the low voltage section 306 operates between 0 Volts and 0.9 Volts. In the latter example, the output level shifting circuit 300 may be implemented using 1.2 Volt transistors with low-voltage transistors that operate at core voltage. The output level shifting circuit 300 includes biasing circuits 308 that can improve dynamic and/or static performance of circuits that drive the output 310. An intermittent dynamic bias circuit 318 may be configured to boost gate overdrive voltage while the output 310 is transitioning or switching between maximum voltage levels. The dynamic bias circuit 318 can ensure a fast transient response to changes in the input 312. A parallel path DC bias circuit 320 may be configured to ensure optimum level shifter speed performance, when no transients are present in the input 312. The parallel path DC bias circuit 320 may be configured to ensure optimum level shifter static performance when no transients are present.

The speed of operation of level shifters may be restricted by voltage variations on either or both supplies and by process, voltage and temperature (PVT) variations that individually or in combination can result in insufficient gate overdrive voltage on the 1.2 Volt transistors. In some devices, insufficient gate overdrive voltage may be addressed by increasing the size of the 1.2 Volt transistor to account for the reduced overdrive voltage, thereby significantly increasing the area of the level shifters. In some devices, insufficient gate overdrive voltage may be addressed through the use of sub-threshold voltage (sub-$V_t$) current paths to bias the gates of transistors at different normal threshold voltage levels (general-purpose threshold voltage, or $V_{tg}$). The latter technique can be unreliable. In some devices, insufficient gate overdrive voltage may be addressed through the use of multiple intermediate supplies.

A dual-voltage, output level shifting circuit 300 provided in accordance with certain aspects of the present disclosure may be configurable for operation at 1.2 Volts and 1.8 Volts using 1.2 Volt devices in addition to low-voltage transistors operable at core voltage. Circuits and techniques are disclosed that support transient and static operations using techniques that can enhance level shifter speed performance and ensure reliable operation without increased transistor size and without the need for multiple intermediate supplies.

In one aspect, intermittent dynamic bias may be applied to the gate of a transistor to support transient operation. The intermittent dynamic bias may be superimposed on a direct current (DC) bias. In another aspect, a parallel path DC bias system is employed to support static operation. These and other aspects of the disclosure can improve speed performance of the level shifter without increasing the semiconductor real estate (area) used for the level shifter. In another aspect, gates may be biased using subthreshold leakage current paths. Subthreshold leakage may also be referred to as subthreshold conduction or subthreshold drain current and corresponds to the current flowing between the source and drain of a MOSFET when the transistor is in the weak-inversion region associated with gate-to-source voltages below the threshold voltage.

In operation, an intermittent dynamic bias scheme can ensure a fast transient response to any changes in input by boosting gate overdrive voltage at the time of switching. For a steady state input, when there are no transients, the unique parallel path DC bias system ensures optimum level shifter speed performance.

In certain implementations, the output level shifting circuit 300 may be implemented using metal-oxide-semiconductor field effect transistors including a combination of P-type metal-oxide-semiconductor (PMOS) transistors and N-type metal-oxide-semiconductor (NMOS) transistors. In this disclosure, PMOS transistors may be identified using the identifier format Mpx, where "x" is a number that is assigned sequentially. In this disclosure, NMOS transistors may be identified using the identifier format Mny, where "y" is a number that is assigned sequentially.

FIGS. 4-7 illustrate examples of output drivers 400, 600 configured in accordance with certain aspects disclosed herein. The output drivers 400, 600 may be implemented using certain process technologies that provide low-voltage transistors configured for 0.9 Volt operation and higher-voltage transistors operable at 1.2 Volts, and that do not provide transistors that operate above 1.2 Volts. The process technology may not support transistors of 1.8 Volt devices and may need to support operation in a 1.8 Volt voltage domain 106 using 1.2 Volt transistors. Specifications and tolerances of the 1.2 Volt transistors typically do not permit the devices to be driven directly between rail voltages of 0 Volts and 1.8 Volts, and an intermediate voltage may be used in some implementations. The intermediate voltage may lie between the rail voltages. For the purposes of this disclosure, the highest voltage power supply rail is referred to as vddpx, the lowest voltage power supply rail is referred to as vssx, and the intermediate voltage power supply rails are referred to as vddix and vssix. In one example, vddpx=1.8 Volts, vssx=0 Volts, and vddix=vssix=0.9 Volts. In another example, vddpx=1.2 Volts, vssx=0 Volts, vddix=1.2 Volts and vssix=0 Volts. The output drivers 400, 600 may receive complementary inputs and may provide substantially symmetrical voltage level shifting circuits to produce a complementary output pair.

Figure 4:
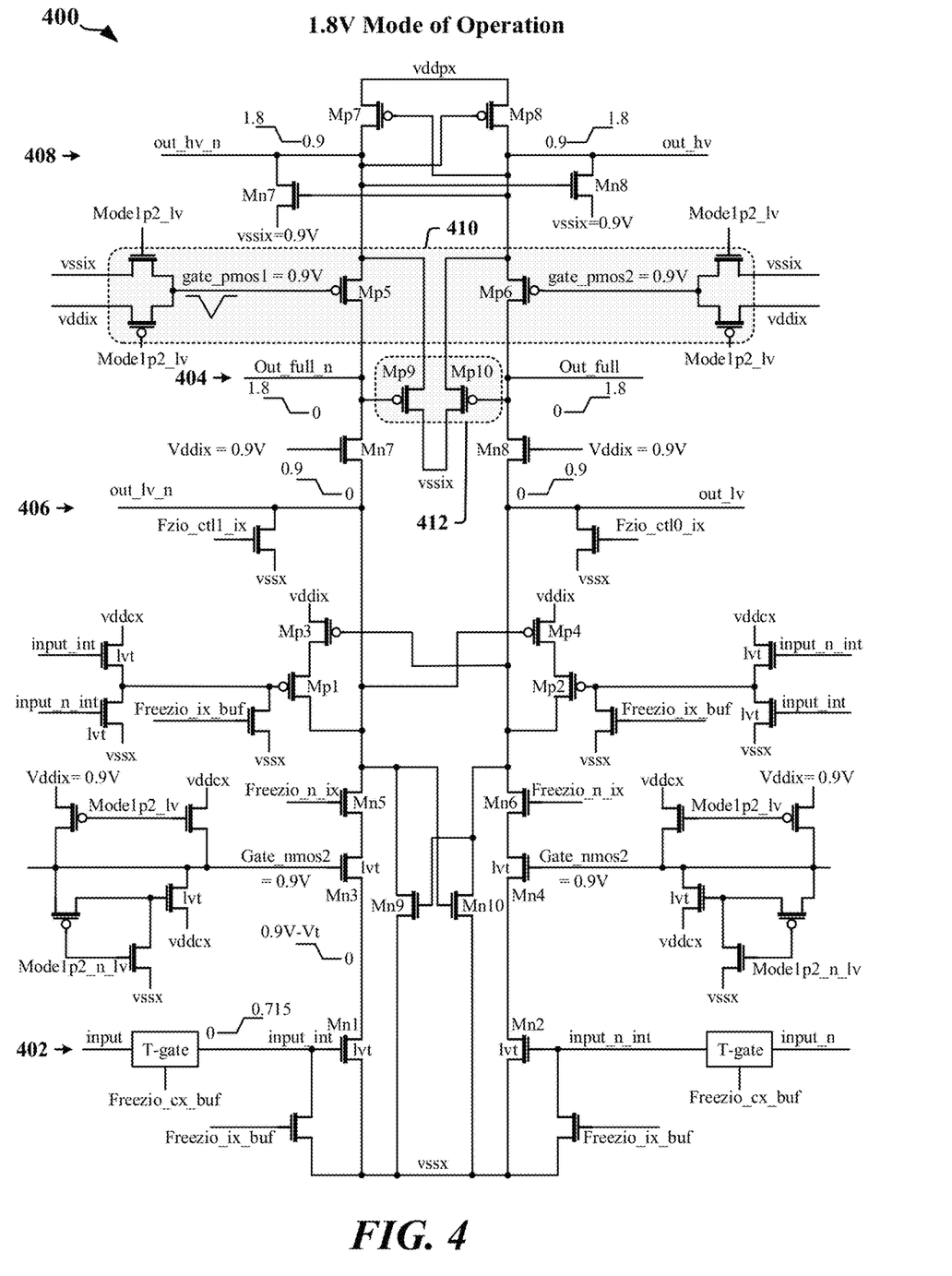
FIGS. 4 and 5 relate to an example of an output driver configured for 1.8 Volt mode of operation in accordance with certain aspects disclosed herein.
Figure 5:
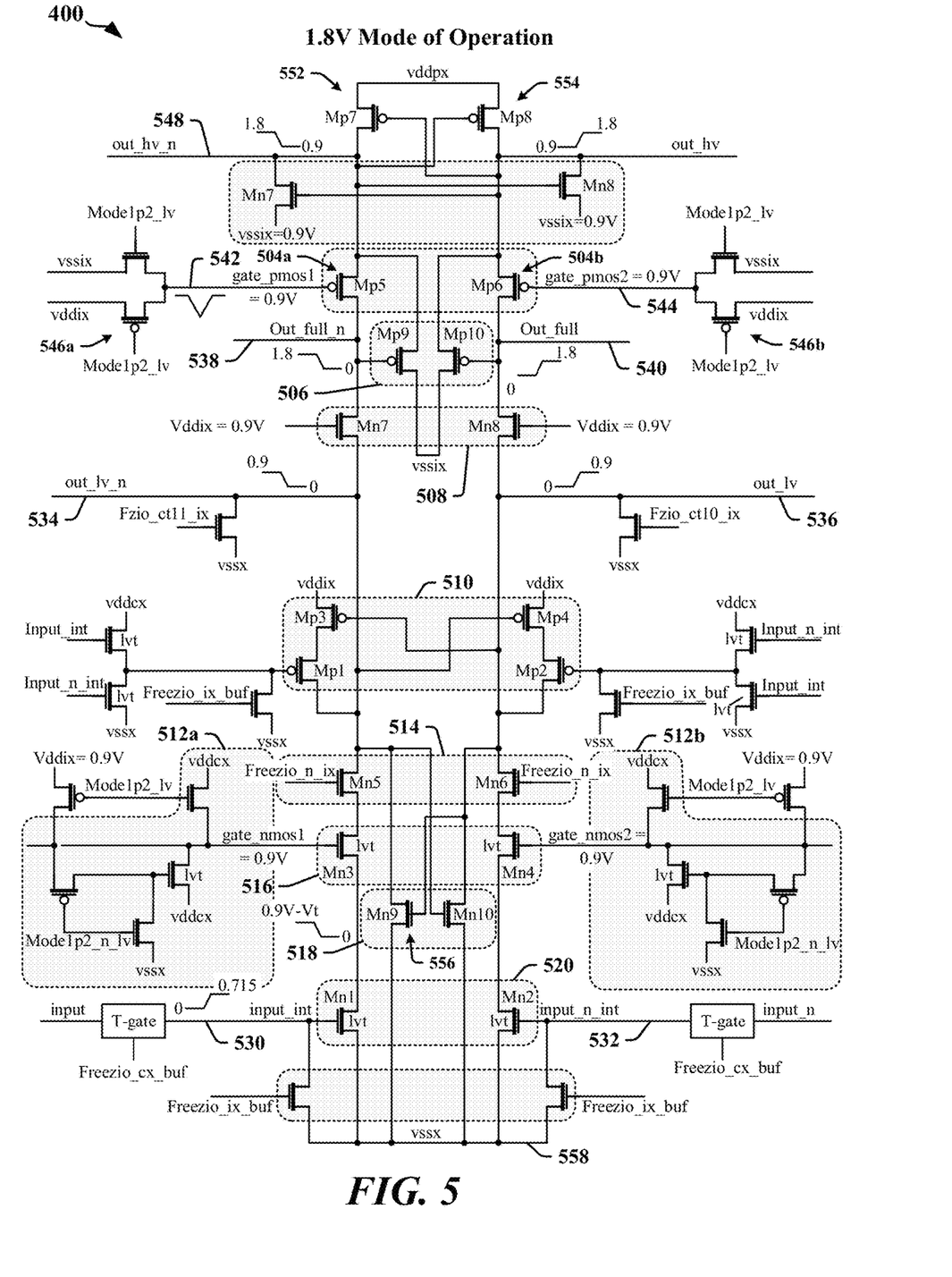

FIGS. 4 and 5 relate to an example of an output driver 400 configured for 1.8 Volt mode of operation in accordance with certain aspects disclosed herein. With reference to FIG. 4, the output driver 400 is configured to receive input 402 at core voltage levels. In the illustrated example, the core voltage may operate at 0.9 Volts. The output of the output driver 400, which may be referred to as the full output 404, can switch between 0 Volts and 1.8 Volts using a combination of low-voltage transistors and 1.2 Volt transistors. The low-voltage transistors may operate at the core voltage level.

The output driver 400 includes a high-voltage section that includes 1.2 Volt transistors configured to provide a high voltage output 408 and a low-voltage section that includes 1.2 Volt transistors configured to provide a low voltage output 406. In one example, the high voltage section drives the high voltage output 408 between 0.9 Volts and 1.8 Volts while the low voltage section drives the low voltage output 406 between 0 Volts and 0.9 Volts. An intermittent dynamic bias circuit 410 provides a fast transient response and a parallel path DC bias circuit 412 supports static operation.

FIG. 5 illustrates certain operational aspects of the output driver 400. Low-voltage transistors 520 receive input 530, 532 from the core domain. Bias circuits 512a, 512b provide bias signals (gate_nmos1 and gate_nmos2, respectively) with a constant bias of vddix to transistors 516, where vddix may be nominally set to 0.9 Volts. Low-voltage transistors 516 protect transistors 520 during 1.2V mode operation. Transistors 508 are provided a constant 0.9 Volt bias voltage (vddix) and are configured to ensure no overstress occurs on transistors 514 (Mn5 and Mn6), when a freeze I/O signal is active (freezio=1) and indicates that the output is to be latched.

The drains of transistors 508 can swing up to 1.8V. When the input 530 is set to vddcx, the negative low-voltage output 534 and the negative full output 538 swing to 0 Volts. Transistors 504a, 504b receive a constant vddix bias signal 542, 544 through a weak MOS resistance. The weak MOS resistance may include or correspond to the resistance between the drain and the source of the transistor 546a or 546b. A transition on a full output 538, 540 is capacitively coupled through the gate of the transistor 504a or 504b and changes the corresponding bias signal 542, 544 by a magnitude and duration defined or calculated based on the gate capacitance and drain-to-source resistance. In one example, intermittent dynamic bias is provided when a transition to 0 Volts of the negative full output 538 is coupled to the vddix bias signal 542, providing an additional gate overdrive to the MP5 transistor 504a. The additional gate overdrive to the MP5 transistor 504a helps to pull the negative high-voltage output 548 to vssix, turning on the MP8 transistor 554 and turning off the MP7 transistor 552. In one aspect, transients in the negative full output 538 may be coupled to a gate of the MP5 transistor 504a and may cause intermittent modifications of the bias provided to the applied to the gate of the MP5 transistor 504a. For a 1.8 Volt mode of operation, vssix is defined as 0.9 Volts. Concurrently, the positive full output 540 is pulled to vddpx and the positive low-voltage output 536 is pulled to vddix.

Transistors 510 assist restoration of the voltage on positive low-voltage output 536 to vddix from vddix −Vt, and/or when the freeze I/O signal is active (freezio=1). Similarly, transistors 508 assist restoration of the voltage on the negative high-voltage output 548 from vssix+Vt to vssix and/or when the freeze I/O signal is active (freezio=1).

A parallel path DC bias circuit 506 includes transistors 518 (MP9 and MP10). In a first cycle, where the input 530 is initialized to vddcx, negative full output 538 is initially set to 0 Volts and there is no coupling between negative full output 538 and vddix bias signal 542. Here transistor 556 (MP9) turns on and provides a secondary path to discharge the negative full output 538 to vssix 558. Transistors 518 may also help latch positive low-voltage output 536 and negative low-voltage output 534 to their current values when freezio is asserted.

Figure 6:
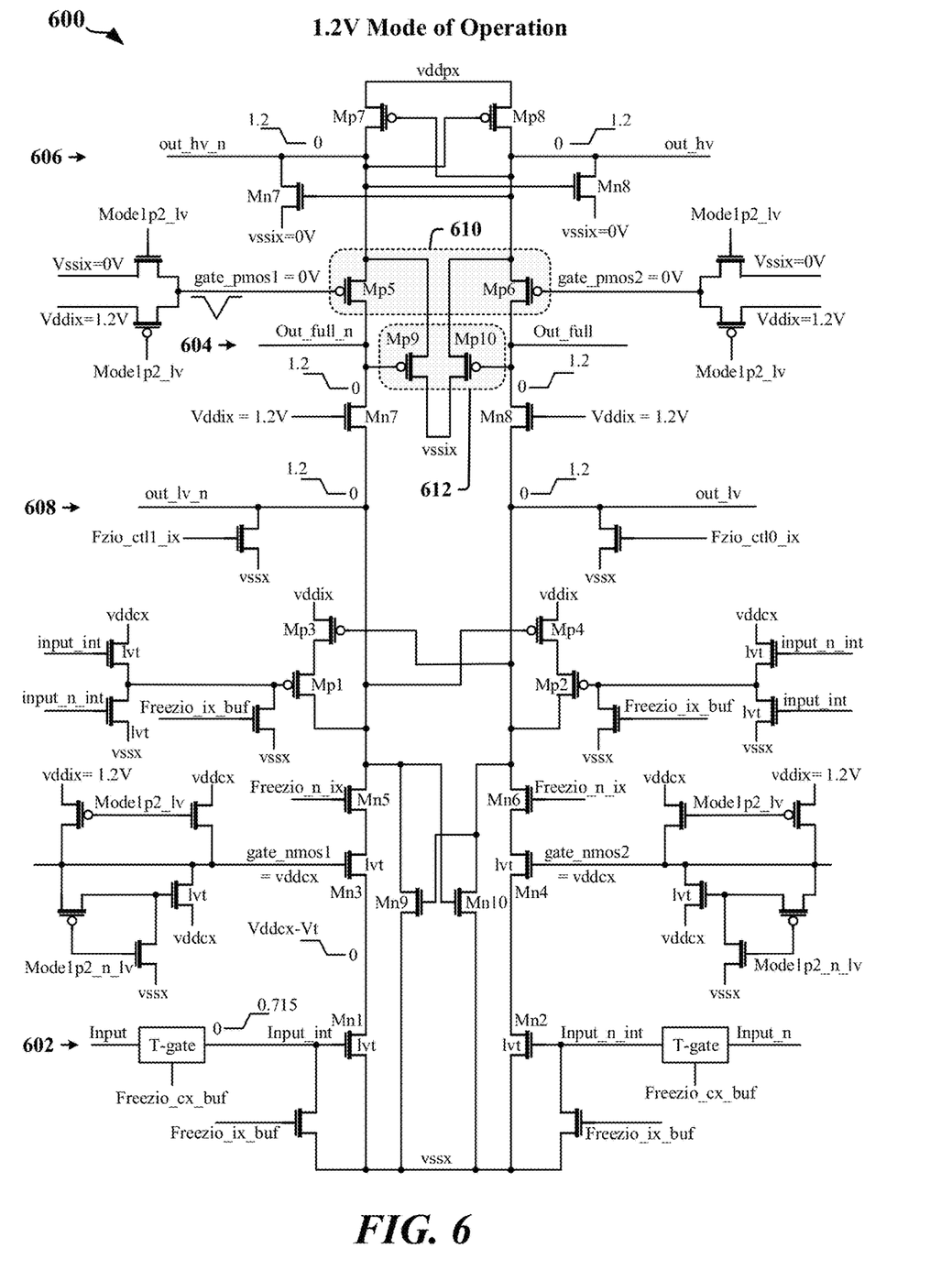
FIGS. 6 and 7 relate to an example of an output driver configured for 1.2 Volt mode of operation in accordance with certain aspects disclosed herein.
Figure 7:
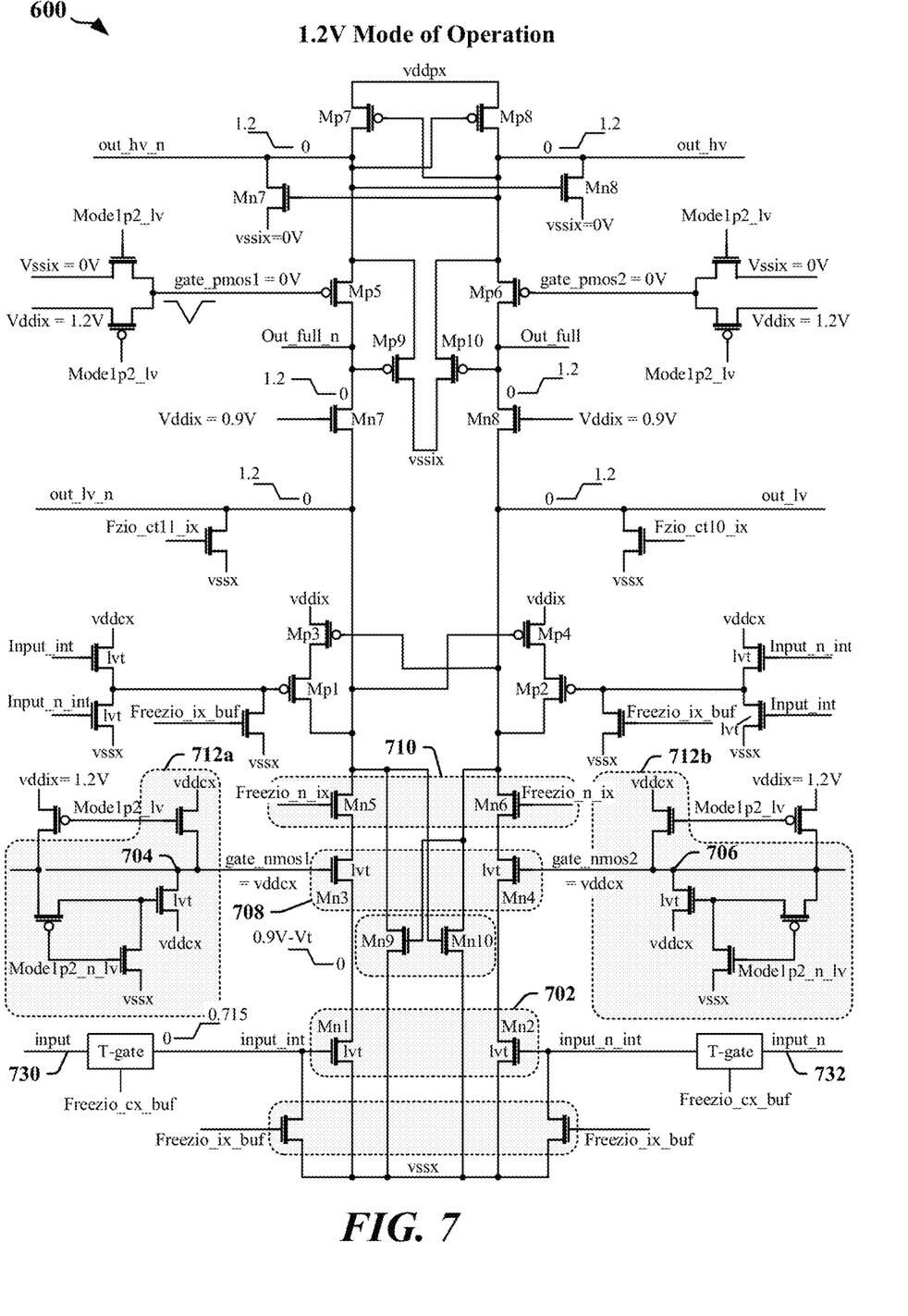

FIGS. 6 and 7 relate to an example of an output driver 600 configured for 1.2 Volt mode of operation in accordance with certain aspects disclosed herein. In certain respects, the output driver 600 can operate in a similar manner to the 1.8 Volt output driver 400 of FIGS. 4 and 5. In one difference, vssix is defined as 0 Volts and vddix is defined as 1.2 Volts for 1.2 Volt mode of operation.

With reference to FIG. 6, the output driver 600 is configured to receive input 602 at core voltage levels. In the illustrated example, the core voltage may operate at 0.9

Volts. The output, which may be referred to as the full output 604 may switch between 0 Volts and 1.2 Volts. The output driver 600 includes a high-voltage section that includes 1.2 Volt transistors configured to provide a high voltage output 606 and a low-voltage section that includes 1.2 Volt transistors configured to provide a low voltage output 608. In one example, the high voltage section and the low voltage section switch between 0 Volts and 1.2 Volts driving the full output 604 between 0 Volts and 1.2 Volts. An intermittent dynamic bias circuit 610 provides a fast transient response and a parallel path DC bias circuit 612 supports static operation.

FIG. 7 illustrates certain operational aspects of the output driver 600. Low-voltage transistors 702 receive input signals 730, 732 from the core domain. Bias signals 704, 706 (gate_nmos1 and gate_nmos2) provide a constant voltage of vddcx to transistors 708. Since vddix may be rise to 1.3 Volts, vddix cannot be applied to the gates of transistors 708 without risking the voltage between drain and source exceeding the limits of the specifications that affect reliability of operation of the transistors 702. Similarly, since the gate bias of transistors 710 can rise to 1.3V, transistors 708 help to ensure that the voltage between drain and source reliability specifications of transistors 702 are not exceeded.

Low-voltage transistors 708 protect transistors 702 during 1.2V mode of operation. Bias circuits 712a, 712b provide bias signals (gate_nmos1 and gate_nmos2, respectively) at a constant 0.9 Volt bias voltage (vddcx) to transistors 708. Transistors 708 are configured to ensure no overstress occurs on transistors 702 (Mn1 and Mn2).

Figure 8:
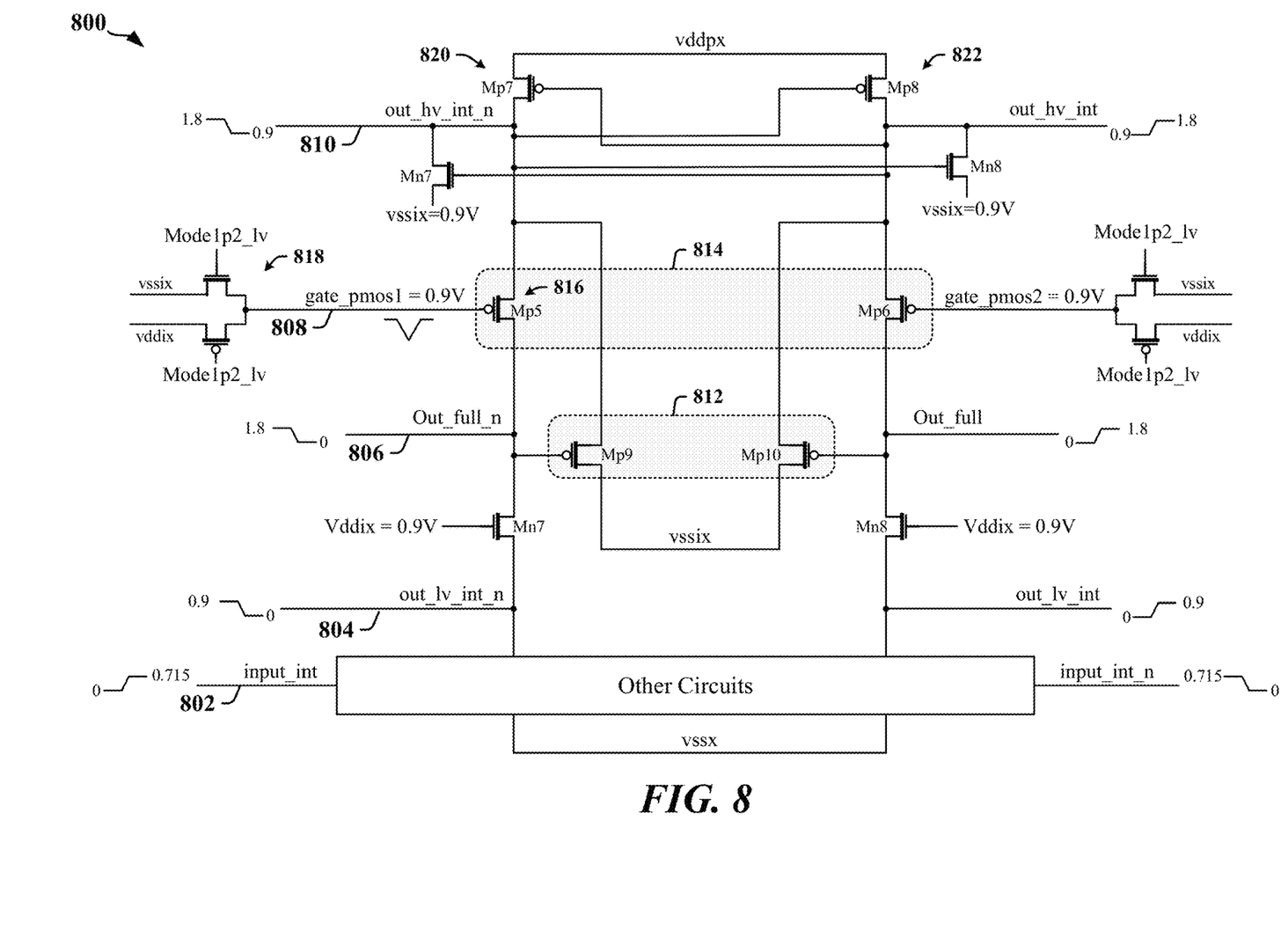
FIGS. 8 and 9 illustrate an example of switching in an output driver in accordance with certain aspects disclosed herein.
Figure 9:
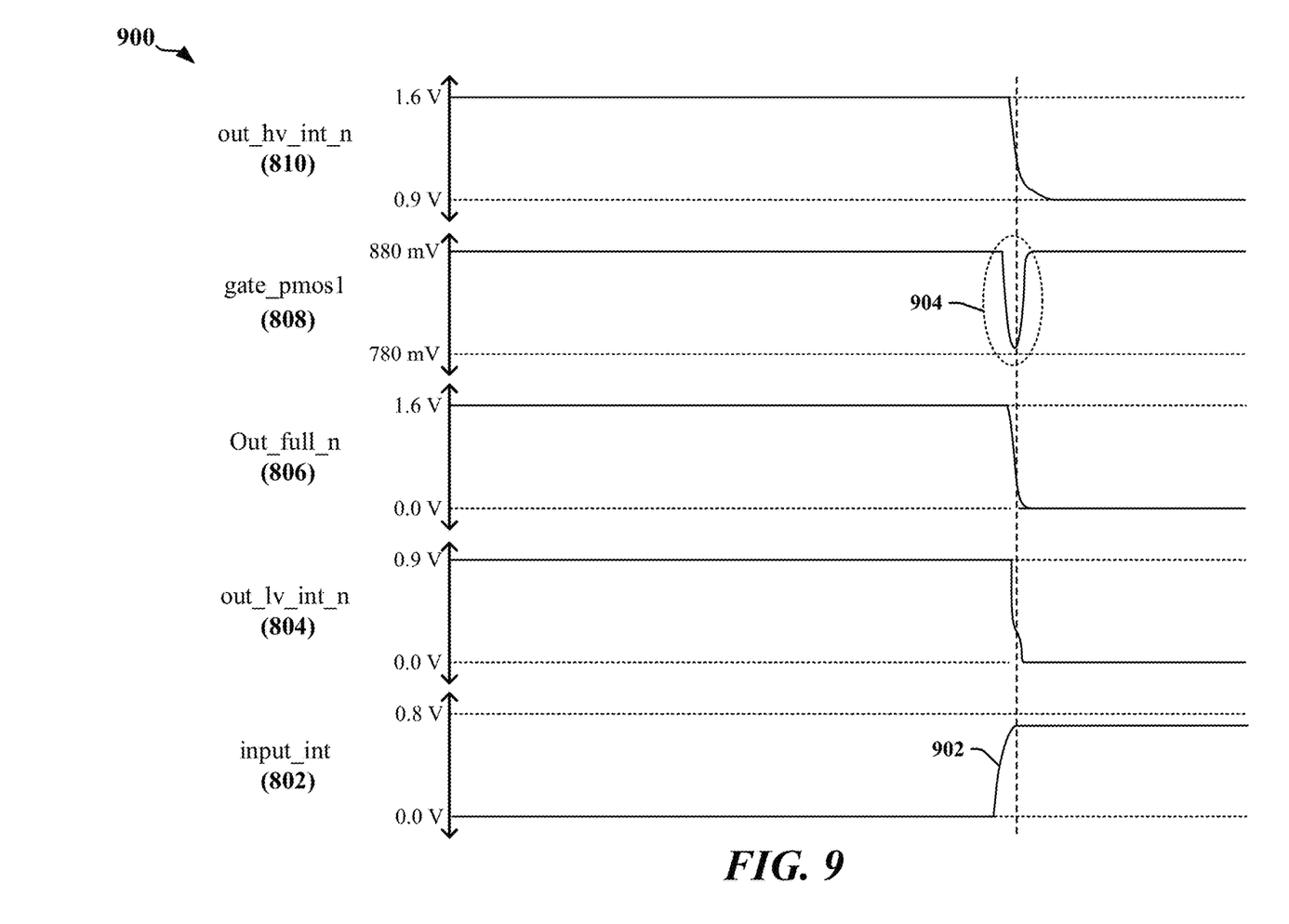

FIGS. 8 and 9 illustrate an example of switching in an output driver 800 configured for 1.8 Volt mode of operation in accordance with certain aspects disclosed herein. The output driver 800 may correspond to the output driver 400 illustrated in FIGS. 4 and 5. With reference to FIG. 8, the output driver 800 is configured to receive input 802 at core voltage levels. In the illustrated example, the core voltage may operate at voltage levels up to 0.9 Volts. The output of the output driver 800, which may be referred to as the full output 806, can switch between 0 Volts and 1.8 Volts using a combination of low-voltage transistors and 1.2 Volt transistors. The low-voltage transistors may operate at the core voltage level.

The output driver 800 includes a high-voltage section that includes 1.2 Volt transistors configured to provide a high voltage internal output including a negative high voltage internal output 810 and a low-voltage section that includes 1.2 Volt transistors configured to provide a low voltage internal output including a negative low voltage internal output 804. In one example, the high voltage section drives the negative high voltage internal output 810 between a nominal 0.9 Volts and a nominal 1.8 Volts while the low voltage section drives the negative low voltage internal output 804 between 0 Volts and a nominal 0.9 Volts. An intermittent dynamic bias circuit 814 provides a fast transient response and a parallel path DC bias circuit 812 supports static operation.

FIG. 9 is a timing diagram 900 that illustrates certain signaling related to a transition 902 in the input 802. Initially, the input 802 is at 0 volts and switches to vddcx during the transition 902, causing the negative low voltage internal output 804 and the full output 806 swing to 0 Volts. The Mp5 transistor 816 receives a constant vddix bias signal 808 through a weak MOS resistance. The weak MOS resistance may include or correspond to the resistance between the drain and the source of one of the transistor pair 818. A transition on the full output 806 is capacitively coupled through the gate of the Mp5 transistor 816 causing a short pulse 904 in the bias signal 808. The magnitude and duration of the pulse 904 is defined or calculated based on the gate capacitance and drain-to-source resistance. The pulse 904 operates as an intermittent dynamic bias added to the bias signal 808, providing an additional gate overdrive to the MP5 transistor 816. The additional gate overdrive to the MP5 transistor 816 helps to pull the negative high-voltage internal output 810 to vssix (here, vssix=0.9 Volts), turning on the MP8 transistor 822 and turning off the MP7 transistor 820.

Figure 10:
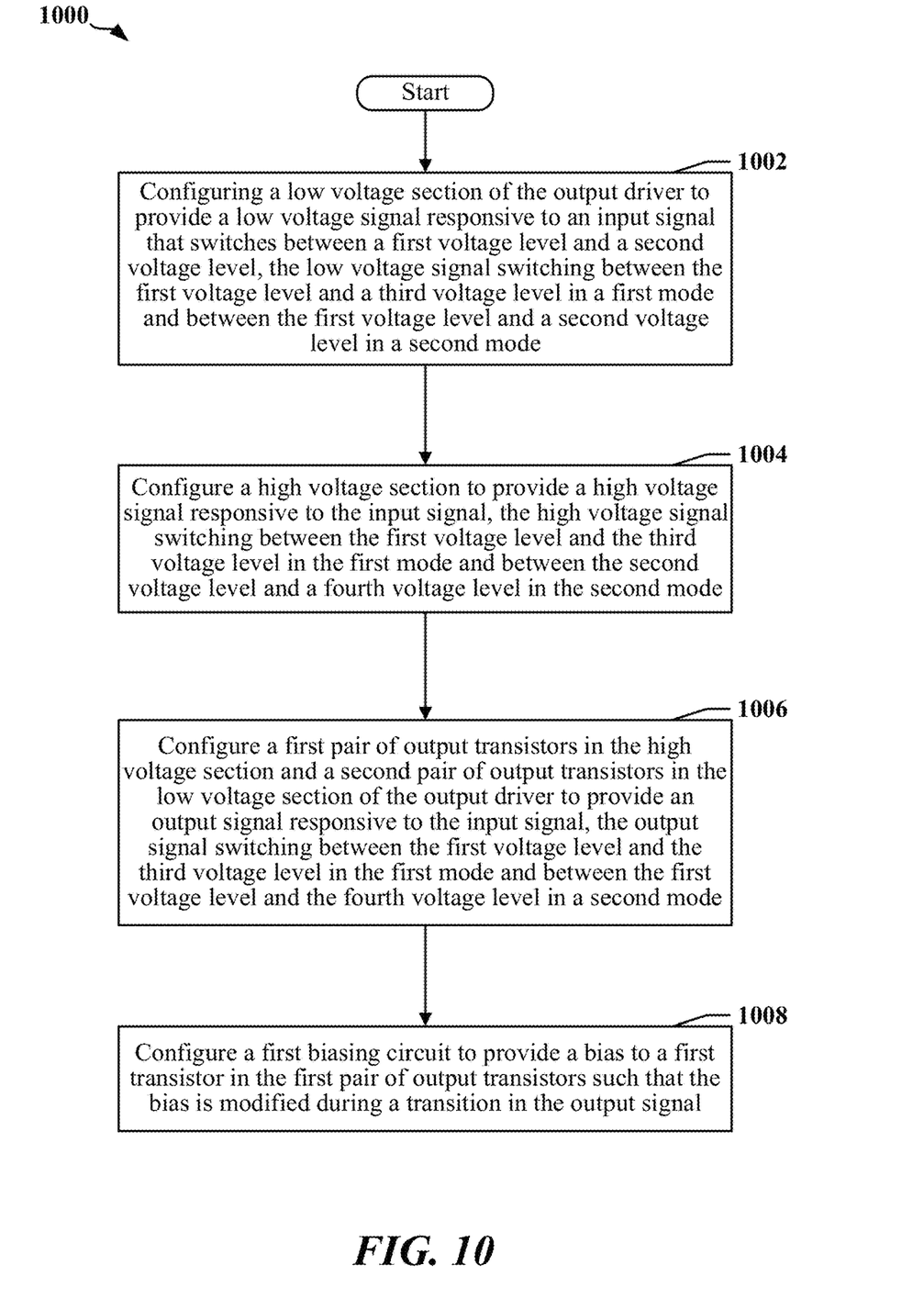
FIG. 10 is a flow chart of a method that may be performed at an output driver in accordance with certain aspects disclosed herein.

FIG. 10 is a flow chart 1000 of a method for configuring an output driver. In one aspect the output driver may be configured as a voltage shifting output driver. The method may relate to a high-speed I/O pad incorporated in a modem 230 or application processor 232 (see FIG. 2), for example. In another example, the method may relate to a high-speed I/O pad incorporated in an RF front-end device.

At block 1002, a low voltage section of the output driver may be configured to provide a low voltage signal responsive to an input signal that switches between a first voltage level and a second voltage level. The low voltage signal may switch between the first voltage level and a third voltage level in a first mode and between the first voltage level and a second voltage level in a second mode. In one example, the low voltage section operates at a nominal voltage level of 1.2 Volt range. In another example, the low voltage section operates at a nominal voltage level of 0.9 Volts. In another example, the low voltage section operates at a minimum voltage level of 0.465 Volts.

At block 1004, a high voltage section of the output driver may be configured to provide a high voltage signal responsive to the input signal. The high voltage signal may switch between the first voltage level and the third voltage level in the first mode and between the second voltage level and a fourth voltage level in the second mode.

At block 1006, output transistors are configured to provide an output signal responsive to the input signal. In one aspect, a first pair of output transistors is provided in the high voltage section and a second pair of output transistors is provided in the low voltage section of the output driver. The output signal may switch between the first voltage level and the third voltage level in the first mode and between the first voltage level and the fourth voltage level in a second mode.

At block 1008, a first biasing circuit is configured to provide a bias to a first transistor in the first pair of output transistors such that the bias is modified during a transition in the output signal.

In one example, the bias is provided to the first transistor through an active transistor that has a drain-to-source resistance, and the output signal is capacitively coupled to the first biasing circuit through a gate to drain capacitance of the first transistor. The bias may be modified for a duration determined by an RC time constant associated with capacitive coupling between the drain and gate of the first transistor.

In some examples, a second biasing circuit is configured to turn on a second transistor in the high voltage section when the output signal is at a low voltage level. The second transistor may be configured to discharge a terminal of the first transistor.

In one example, the first voltage level corresponds to a 0 Volt level, the second voltage level corresponds to a 0.9 Volt level. In one example, the third voltage level corresponds to a 1.2 Volt level. In one example, the fourth voltage level corresponds to a 1.8 Volt level. The input signal may switch between 0 Volts and 0.9 Volts. For example, the input signal may be received from 0.9 Volt core logic of an IC. The output signal may be provided to an input/output pad of the IC.

An output driver configured in accordance with certain aspects of this disclosure may include a low voltage section, a high voltage section, output transistors and one or more biasing circuits. The low voltage section may be configured to provide a low voltage signal responsive to an input signal that switches between a first voltage level and a second voltage level. The low voltage signal may switch between the first voltage level and a third voltage level in a first mode of operation and between the first voltage level and a second voltage level in a second mode of operation. The high voltage section may be configured to provide a high voltage signal responsive to the input signal. The high voltage signal may switch between the first voltage level and the third voltage level in the first mode of operation and between the second voltage level and a fourth voltage level in the second mode of operation.

A first pair of output transistors in the high voltage section and a second pair of output transistors in the low voltage section are configured to provide an output signal responsive to the input signal. The output signal may switch between the first voltage level and the third voltage level in the first mode of operation and between the first voltage level and the fourth voltage level in a second mode of operation.

A first biasing circuit may be configured to provide a bias to a first transistor in the first pair of output transistors such that the bias is modified during a transition in the output signal. The bias may be provided to the first transistor through an active transistor that has a drain-to-source resistance ($R_{DS}$) that may be less than one ohm. For example, an active transistor may operate as a switch and may have an $R_{DS}$ value of 0.1 ohm. The output signal may be capacitively coupled to the first biasing circuit through a gate to drain capacitance ($C_{GD}$) of the first transistor. The voltage level of the bias may be modified for a duration determined by the RC time constant associated with the capacitive coupling between the drain and gate of the first transistor. For example, the RC time constant may be calculated using $R_{DS}$ and $C_{GD}$ values.

In some examples, a second biasing circuit is configured to turn on a second transistor in the high voltage section when the output signal is at a low voltage level. The second transistor may be configured to discharge a terminal of the first transistor.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus, comprising:
    a low voltage section configured to provide a low voltage signal responsive to an input signal that switches between a first voltage level and a second voltage level, the low voltage signal switching between the first voltage level and a third voltage level in a first mode and between the first voltage level and the second voltage level in a second mode;
    a high voltage section configured to provide a high voltage signal responsive to the input signal, the high voltage signal switching between the first voltage level and the third voltage level in the first mode and between the second voltage level and a fourth voltage level in the second mode;
    a first pair of output transistors in the high voltage section and a second pair of output transistors in the low voltage section configured to provide an output signal responsive to the input signal, the output signal switching between the first voltage level and the third voltage level in the first mode and between the first voltage level and the fourth voltage level in the second mode; and
    a first biasing circuit configured to provide a bias signal to a first transistor in the first pair of output transistors by coupling a gate of the first transistor to a power supply rail through a weak resistance, wherein the first biasing circuit is coupled to the output signal through a capacitance and provides a pulse in the bias signal in response to a transition in the output signal.

2. The apparatus of claim 1, wherein the gate of the first transistor is coupled to the power supply rail through an active transistor that has a drain-to-source resistance that is included in the weak resistance, and wherein the output signal is capacitively coupled to the bias signal through the gate of the first transistor.

3. The apparatus of claim 1, wherein the duration of the pulse in the bias signal is determined by a resistance-capacitance (RC) time constant provided by the weak resistance and a gate-to-drain capacitance of the first transistor.

4. The apparatus of claim 1, further comprising:
    a parallel path biasing circuit configured to turn on a second transistor in the high voltage section when the output signal is at a low voltage level, wherein the second transistor is provided in parallel to the first transistor and configured to discharge a terminal of the first transistor.

5. The apparatus of claim 1, wherein the first voltage level corresponds to a 0 Volts level, the second voltage level corresponds to a 0.9 Volt level and the third voltage level corresponds to a 1.2 Volt level.

6. The apparatus of claim 5, wherein the fourth voltage level corresponds to a 1.8 Volt level.

7. The apparatus of claim 1, wherein the first voltage level corresponds to a 0 Volts level, the second voltage level corresponds to a 0.9 Volt level and the fourth voltage level corresponds to a 1.8 Volt level.

8. The apparatus of claim 7, wherein the third voltage level corresponds to a 1.2 Volt level.

9. The apparatus of claim 1, the first voltage level corresponds to a 0 Volts level, the third voltage level corresponds to a 1.2 Volt level and the fourth voltage level corresponds to a 1.8 Volt level.

10. The apparatus of claim 1, wherein the input signal switches between 0 Volts and 0.9 Volts, wherein the input signal is received from core logic of an integrated circuit, and wherein the output signal is provided to an input/output pad of the integrated circuit.

11. A method for configuring an output driver, comprising:
configuring a low voltage section of the output driver to provide a low voltage signal responsive to an input signal that switches between a first voltage level and a second voltage level, the low voltage signal switching between the first voltage level and a third voltage level in a first mode and between the first voltage level and the second voltage level in a second mode;
configuring a high voltage section to provide a high voltage signal responsive to the input signal, the high voltage signal switching between the first voltage level and the third voltage level in the first mode and between the second voltage level and a fourth voltage level in the second mode;
configuring a first pair of output transistors in the high voltage section and a second pair of output transistors in the low voltage section of the output driver to provide an output signal responsive to the input signal, the output signal switching between the first voltage level and the third voltage level in the first mode and between the first voltage level and the fourth voltage level in the second mode; and
configuring a first biasing circuit to provide a bias signal to a first transistor in the first pair of output transistors by coupling a gate of the first transistor to a power supply rail through a weak resistance, wherein the first biasing circuit is coupled to the output signal through a capacitance and provides a pulse in the bias signal in response to a transition in the output signal.

12. The method of claim 11, wherein the gate of the first transistor is coupled to the power supply rail through an active transistor that has a drain-to-source resistance that is included in the weak resistance, and wherein the output signal is capacitively coupled to the bias signal through the gate of the first transistor.

13. The method of claim 11, wherein the duration of the pulse in the bias signal is determined by a resistance-capacitance (RC) time constant provided by the weak resistance and a gate-to-drain capacitance of the first transistor.

14. The method of claim 11, further comprising:
configuring a parallel path biasing circuit to turn on a second transistor in the high voltage section when the output signal is at a low voltage level, wherein the second transistor is provided in parallel to the first transistor and configured to discharge a terminal of the first transistor.

15. The method of claim 11, wherein the first voltage level corresponds to a 0 Volts level, the second voltage level corresponds to a 0.9 Volt level and the third voltage level corresponds to a 1.2 Volt level.

16. The method of claim 15, wherein the fourth voltage level corresponds to a 1.8 Volt level.

17. The method of claim 11, wherein the first voltage level corresponds to a 0 Volts level, the second voltage level corresponds to a 0.9 Volt level and the fourth voltage level corresponds to a 1.8 Volt level.

18. The method of claim 17, wherein the third voltage level corresponds to a 1.2 Volt level.

19. The method of claim 11, wherein the first voltage level corresponds to a 0 Volts level, the third voltage level corresponds to a 1.2 Volt level and the fourth voltage level corresponds to a 1.8 Volt level.

20. The method of claim 11, wherein the input signal switches between 0 Volts and 0.9 Volts, wherein the input signal is received from core logic of an integrated circuit, and wherein the output signal is provided to an input/output pad of the integrated circuit.

21. An apparatus, comprising:
means for providing a low voltage signal responsive to an input signal that switches between a first voltage level and a second voltage level, the low voltage signal switching between the first voltage level and a third voltage level in a first mode and between the first voltage level and the second voltage level in a second mode;
means for providing a high voltage signal responsive to the input signal, the high voltage signal switching between the first voltage level and the third voltage level in the first mode and between the second voltage level and a fourth voltage level in the second mode;
means for providing an output signal responsive to the input signal, the output signal switching between the first voltage level and the third voltage level in the first mode and between the first voltage level and the fourth voltage level in the second mode; and
means for biasing a first output transistor such that a bias signal is provided to the first output transistor through a weak resistance configured to couple a gate of the first output transistor to a power supply rail, wherein the first biasing circuit is coupled to the output signal through a capacitance and provides a pulse in the bias signal in response to a transition in the output signal.

22. The apparatus of claim 21, wherein the gate of the first transistor is coupled to the power supply rail through an active transistor that has a drain-to-source resistance that is included in the weak resistance, and wherein the output signal is capacitively coupled to a first biasing circuit through the gate of the first transistor.

23. The apparatus of claim 21, wherein the duration of the pulse in the bias signal is determined by a resistance-capacitance (RC) time constant provided by the weak resistance and a gate-to-drain capacitance of the first output transistor.

24. The apparatus of claim 21, further comprising:
means for turning on a second transistor when the output signal is at a low voltage level, wherein the second transistor is provided in parallel to the first output transistor and configured to discharge a terminal of the first output transistor.

25. The apparatus of claim 21, wherein the first voltage level corresponds to a 0 Volts level, the second voltage level corresponds to a 0.9 Volt level and the third voltage level corresponds to a 1.2 Volt level.

26. The apparatus of claim 25, wherein the fourth voltage level corresponds to a 1.8 Volt level.

27. The apparatus of claim 21, wherein the first voltage level corresponds to a 0 Volts level, the second voltage level corresponds to a 0.9 Volt level and the fourth voltage level corresponds to a 1.8 Volt level.

28. The apparatus of claim 27, wherein the third voltage level corresponds to a 1.2 Volt level.

29. The apparatus of claim 21, wherein the first voltage level corresponds to a 0 Volts level, the third voltage level corresponds to a 1.2 Volt level and the fourth voltage level corresponds to a 1.8 Volt level.

30. The apparatus of claim 21, wherein the input signal switches between 0 Volts and 0.9 Volts, wherein the input signal is received from core logic of an integrated circuit, and wherein the output signal is provided to an input/output pad of the integrated circuit.

* * * * *

UNITED STATES PATENT AND TRADEMARK OFFICE
CERTIFICATE OF CORRECTION

PATENT NO. : 11,171,649 B1
APPLICATION NO. : 17/071796
DATED : November 9, 2021
INVENTOR(S) : Aliasgar Presswala et al.

It is certified that error appears in the above-identified patent and that said Letters Patent is hereby corrected as shown below:

In the Claims

Column 14, Lines 39-40, Please correct Claim 22 by replacing "first transistor" with "first output transistor."

Signed and Sealed this
Twenty-seventh Day of August, 2024

Katherine Kelly Vidal
*Director of the United States Patent and Trademark Office*